United States Patent
Tsai et al.

(10) Patent No.: US 8,541,877 B2
(45) Date of Patent: Sep. 24, 2013

(54) ELECTRONIC DEVICE PACKAGE AND METHOD FOR FABRICATING THE SAME

(76) Inventors: Chia-Lun Tsai, Tainan (TW); Ching-Yu Ni, Hsinchu (TW); Tien-Hao Huang, Taoyuan (TW); Chia-Ming Cheng, Taipei (TW); Wen-Cheng Chien, Hsinchu (TW); Nan-Chun Lin, Taipei (TW); Wei-Ming Chen, Hsinchu (TW); Shu-Ming Chang, Taipei (TW); Bai-Yao Lou, Hsinchu (TW)

( * ) Notice: Subject to any disclaimer, the term of this patent is extended or adjusted under 35 U.S.C. 154(b) by 188 days.

(21) Appl. No.: 12/849,089

(22) Filed: Aug. 3, 2010

(65) Prior Publication Data

US 2011/0140267 A1    Jun. 16, 2011

Related U.S. Application Data

(60) Provisional application No. 61/286,857, filed on Dec. 16, 2009.

(51) Int. Cl.
*H01L 23/48* (2006.01)

(52) U.S. Cl.
USPC .......................................................... 257/738

(58) Field of Classification Search
USPC ................... 257/737–738, 781, 784, E23.068
See application file for complete search history.

(56) References Cited

U.S. PATENT DOCUMENTS

| | | | |
|---|---|---|---|
| 2003/0134455 A1* | 7/2003 | Cheng et al. | 438/125 |
| 2006/0246624 A1 | 11/2006 | Fuergut et al. | |
| 2009/0160051 A1* | 6/2009 | Lee | 257/737 |

FOREIGN PATENT DOCUMENTS

TW    200300588    6/2003

* cited by examiner

*Primary Examiner* — Hoa B Trinh (74) *Attorney, Agent, or Firm* — Birch, Stewart, Kolasch & Birch, LLP (57) ABSTRACT

The invention provides an electronic device package and a method for fabricating the same. The electronic device package includes a carrier wafer. An electronic device chip with a plurality of conductive pads thereon is disposed over the carrier wafer. An isolation laminating layer includes a lower first isolation layer, which covers the carrier wafer and the electronic device chip, and an upper second isolation layer. The isolation laminating layer has a plurality of openings to expose the conductive pads. A plurality of redistribution patterns is conformably formed on the isolation laminating layer and in the openings. The redistribution patterns are electrically connected to the conductive pads, respectively. A plurality of conductive bumps is respectively formed on the redistribution patterns, electrically connected to the conductive pads.

26 Claims, 9 Drawing Sheets

ELECTRONIC DEVICE PACKAGE AND METHOD FOR FABRICATING THE SAME

CROSS REFERENCE TO RELATED APPLICATIONS

This application claims the benefit of U.S. Provisional Application No. 61/286,857, filed on Dec. 16, 2009, the entirety of which is incorporated by reference herein.

BACKGROUND OF THE INVENTION

1. Field of the Invention

The present invention relates to an electronic device package, and in particular relates to an isolation layer of an electronic device package and a method for fabricating an electronic device package using a wafer scale package (WSP) process.

2. Description of the Related Art

In the conventional electronic device packages, the surroundings of the chip are usually encapsulated by an isolation layer, thereby isolating the chip from a subsequently formed conductive wiring layer. The conventional isolation layer has good resolution to facilitate openings forming therein so that a subsequently formed conductive wiring layer electrically connects to the chip. The conventional isolation layer with good resolution, however, is usually thin, thereby not being able to compatibly satisfy surface flatness, mechanical strength and coefficient thermal expansion (CTE) requirements. Contrarily, an isolation layer compatibly satisfying surface flatness, mechanical strength and coefficient thermal expansion (CTE) requirements must be thick, thereby not being able to satisfy good resolution requirements.

Thus, a novel electronic device package and a method for fabricating the same are desired to satisfy all the aforementioned requirements.

BRIEF SUMMARY OF INVENTION

An exemplary embodiment of a method for fabricating an electronic device package, comprises: providing a carrier wafer; disposing an electronic device chip with a plurality of conductive pads disposed thereon over the carrier wafer; forming a first isolation layer covering the carrier wafer and the electronic device chip, wherein the first isolation layer has a plurality of first openings to respectively expose the plurality of conductive pads; conformably forming a second isolation layer on the first isolation layer and in the plurality of first openings, wherein the second isolation layer has a plurality of second openings corresponding to the plurality of first openings to respectively expose the plurality of conductive pads; conformably forming a plurality of redistribution patterns isolated from each other on the second isolation layer and in the plurality of second openings to electrically connect to the plurality of conductive pads; and forming a plurality of conductive bumps on the a plurality of redistribution patterns to electrically connect to the plurality of conductive pads.

An exemplary embodiment of a method for an electronic device package, comprises: a carrier wafer; an electronic device chip disposed over the carrier wafer, wherein the electronic device chip has a plurality of conductive pads disposed thereon; an isolation combo layer comprising a lower first isolation layer, which covers the carrier wafer and the electronic device chip, and an upper second isolation layer, wherein the isolation combo layer has a plurality of openings to expose the plurality of conductive pads, respectively; a plurality of redistribution patterns isolated from each other conformably formed on the isolation combo layer and in the openings, electrically connecting to the plurality of conductive pads, respectively; and a plurality of conductive bumps respectively formed on the plurality of redistribution patterns, electrically connecting to the plurality of conductive pads.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1b, 2b, 3b, 4b, 5b and 6b are cross sections taken along lines A-A' of FIGS. 1a, 2a, 3a, 4a, 5a and 6a.

FIGS. 8b and 9b are cross sections taken along lines B-B' of FIGS. 8a and 9a.

DETAILED DESCRIPTION OF INVENTION

The following description is of a mode for carrying out the invention. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. This description is made for the purpose of illustrating the general principles of the invention and should not be taken in a limiting sense.

Embodiments of the package structure for chips of the invention packaged by a wafer scale packaging (WSP) process may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer scale packaging process. In addition, the wafer scale packaging process may also be adapted to form electronic device packages of multi-layered integrated circuit devices by stacking a plurality of wafers having integrated circuits together.

Figure 1A:
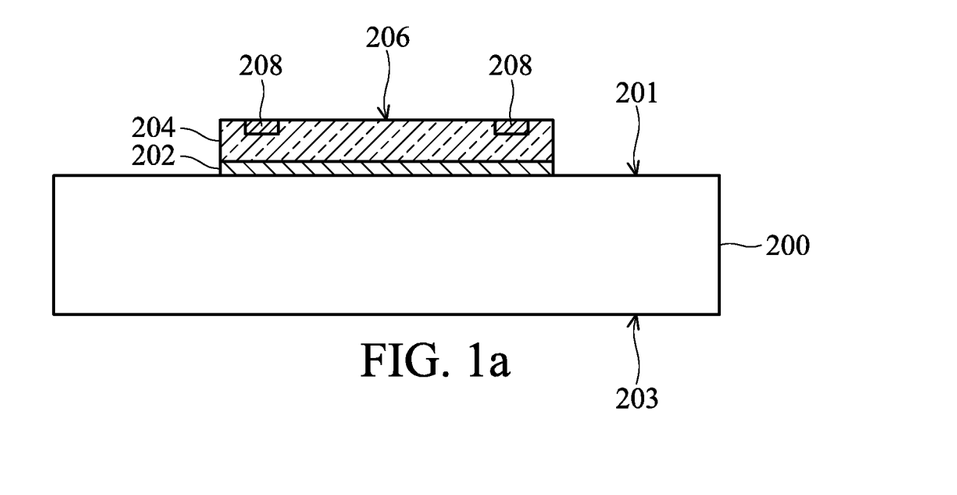
FIGS. 1a, 2a, 3a, 4a, 5a and 6a are top views showing fabrication of an electronic device package according to an embodiment of the invention.
Figure 1B:
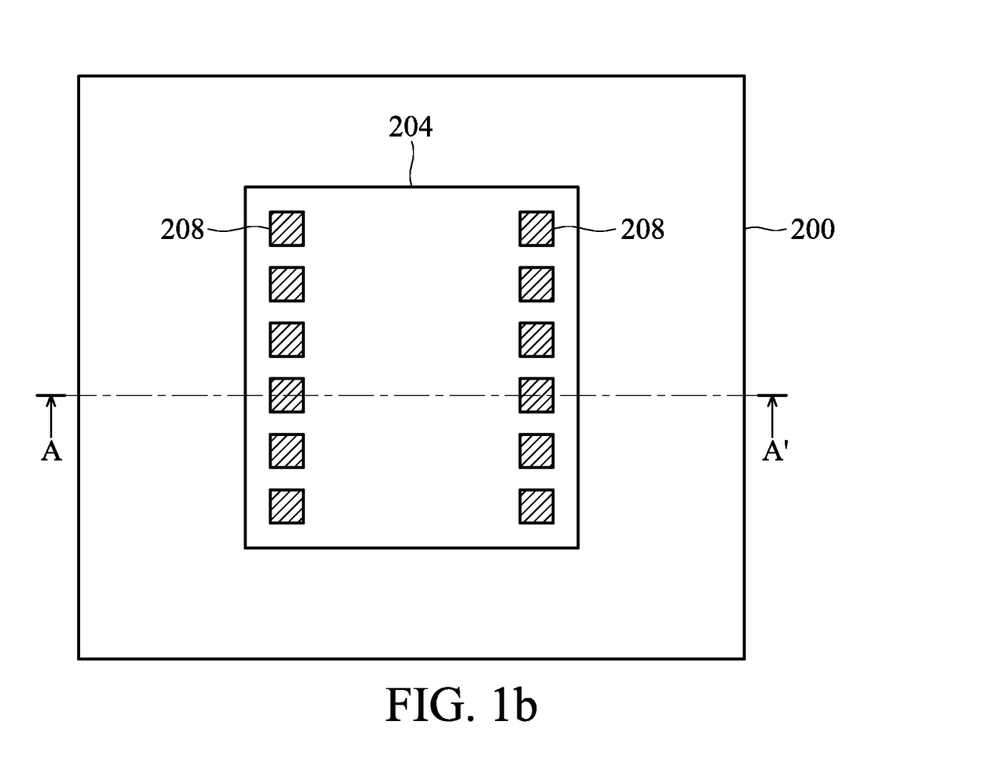
Figure 2A:
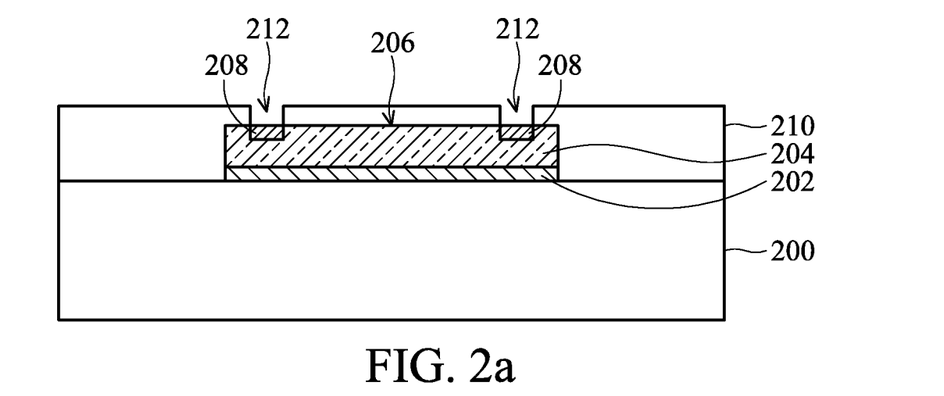
Figure 2B:
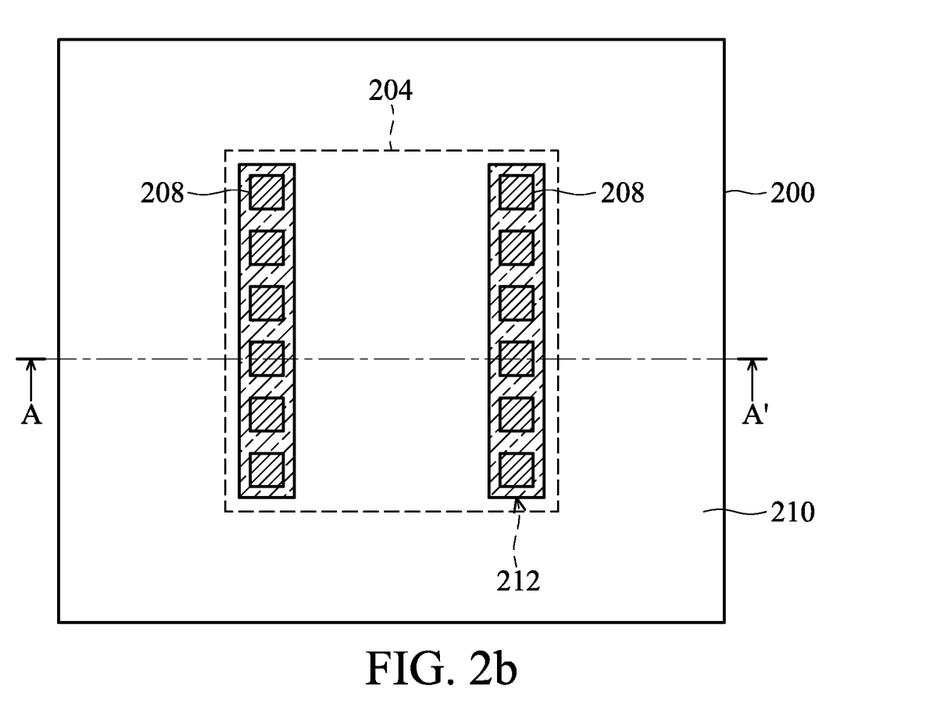

FIGS. 1a, 2a, 3a, 4a, 5a and 6a are top views showing fabrication of an electronic device package 500a according to an embodiment of the invention. FIGS. 1b, 2b, 3b, 4b, 5b and 6b are cross sections taken along lines A-A' of FIGS. 1a, 2a, 3a, 4a, 5a and 6a. As shown in FIGS. 1a and 1b, a carrier wafer 200 is provided. In one embodiment of the invention, the carrier wafer 200 may comprise a bare wafer without any device pattern disposed thereon. The carrier wafer 200 has an upper surface 201 and a lower surface 203. An electronic device chip 204 is disposed over the carrier wafer 200. In one embodiment of the invention, the electronic device chip 204 is disposed over the carrier wafer 200 through an adhesion layer 202 such as conductive silver paste. As shown in FIGS. 1a and 1b, a plurality of conductive pads 208 is disposed in the upper surface 201 of the carrier wafer 200. The conductive pads 208 are used to transmit input/output (I/O), ground or power signals of the electronic device chip 204.

FIGS. 2a and 2b to FIGS. 3a and 3b illustrate a formation of an isolation combo layer 216 of an embodiment of the invention, and the isolation combo layer 216 is used to isolate the surroundings of the electronic device chip 204 from subsequently formed redistribution patterns. Next, referring to FIGS. 2a and 2b, a first isolation layer 210 is formed covering an upper surface 206 of the electronic device chip 204. In one embodiment of the invention, the first isolation layer 210 is mainly used to planarize the surfaces of the carrier wafer 200 and the electronic device chip 204. The first isolation layer 210 may be a dry film photoresist by formation methods comprising vacuum adhering or thermal pressing. A plurality of first openings 212 may be formed in positions of the first isolation layer 210 over formation positions of the conductive pads 208 to respectively expose the conductive pads 208.

Figure 3A:
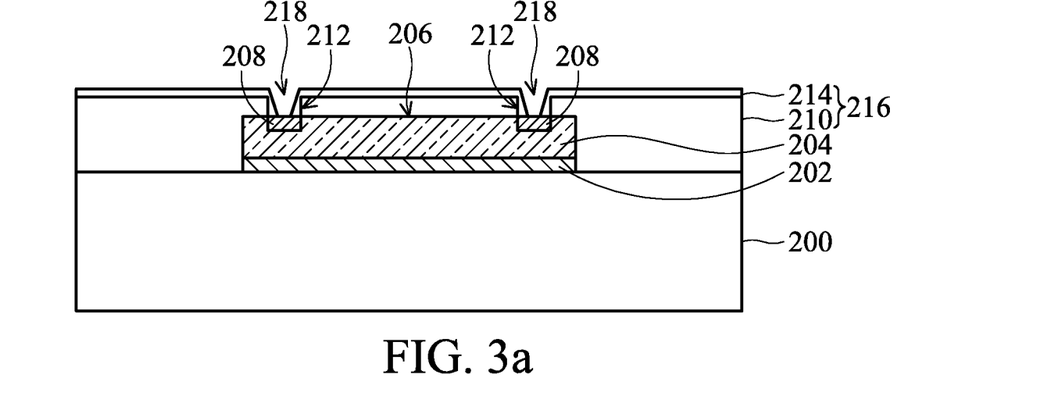
Figure 3B:
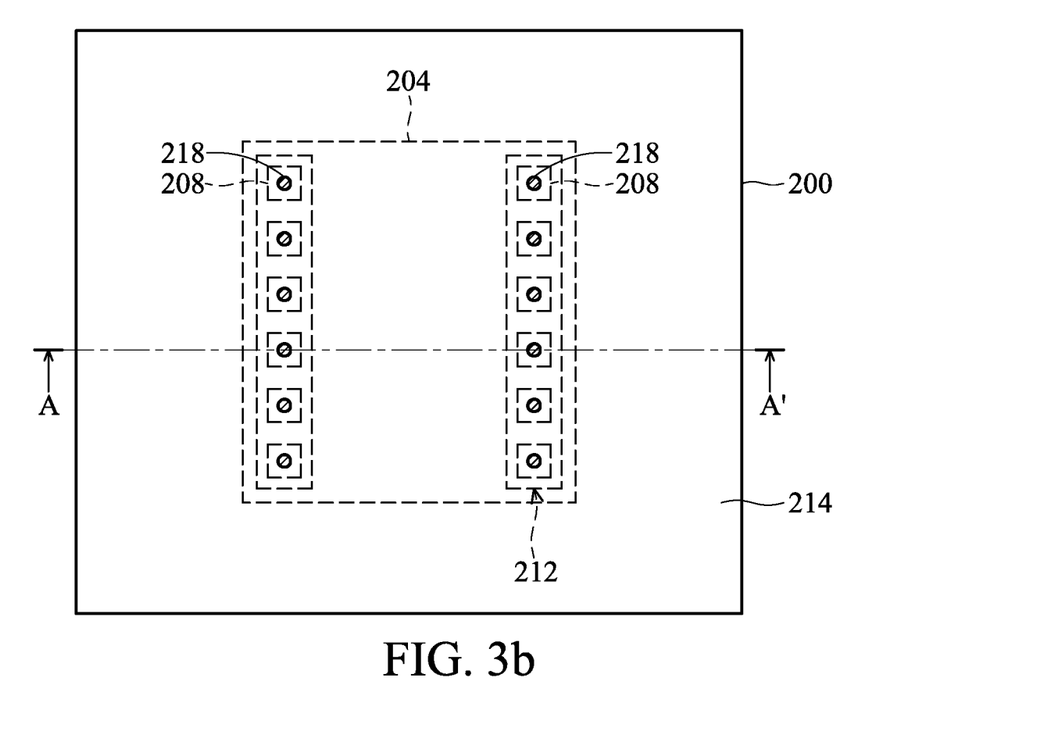

Next, referring to FIGS. 3a and 3b, a second isolation layer 214 is conformably formed on the first isolation layer 210 and in the first opening 212. In one embodiment of the invention, the second isolation layer 214 is mainly provided for openings formed therein to expose the conductive pads 208, thereby facilitating subsequent formation of conductive wires. The second isolation layer 214 may comprise epoxy resin, solder mask layers, silicon oxide layers, silicon nitride layers, silicon oxynitride layers, metal oxides, polyimide, butylcyclobutene (BCB), parylene, polynaphthalenes, fluorocarbons, accrylates or combinations thereof. Formation methods of the second isolation layer 214 may comprise spin coating, spray coating, curtain coating, liquid phase deposition, physical vapor deposition (PVD), chemical vapor deposition (CVD), low pressure chemical vapor deposition (LPCVD), plasma enhanced chemical vapor deposition (PECVD), rapid thermal-CVD (RTCVD) or atmospheric pressure chemical vapor deposition (APCVD). Also, a plurality of second openings 218 may be formed in the second isolation layer 214, over the formation positions of the first opening 212 using photolithography/etching methods, thereby respectively exposing the conductive pads 208. After the aforementioned processes, an isolation combo layer 216 comprising the first isolation layer 210 and the second isolation layer 214 is completely formed.

In one embodiment of the invention, the isolation combo layer 216 is formed by laminating the lower first isolation layer 210 and the upper second isolation layer 214, wherein the first isolation layer 210 and the second isolation layer 214 have different functions, respectively. The first isolation layer 210 is mainly used to planarize the surfaces of the carrier wafer 200 and the electronic device chip 204. Therefore, the first isolation layer 210 such as a dry film photoresist has good surface flatness, and better mechanical strength than the second isolation layer 214 so that a thickness of the first isolation layer 210 is larger than that of the second isolation layer 214. Or, silica particles may be added into the first isolation layer 210 to increase thermal conductivity or adjust coefficient thermal expansion (CTE) thereof to match the CTE of the electronic device chip 204. For precise formation of the openings, exposing the conductive pads 208, to facilitate subsequent formation of conductive wires, it is required that the resolution of the second isolation layer 214 is better than the first isolation layer 210, and the coefficient of viscosity of the second isolation layer 214 is lower than that of the first isolation layer 210. The isolation combo layer 216, formed by laminating the first isolation layer 210 to have a planarization function and the second isolation layer 214 to have a good resolution may have advantages which are the same as isolation layers formed of different materials.

Figure 4A:
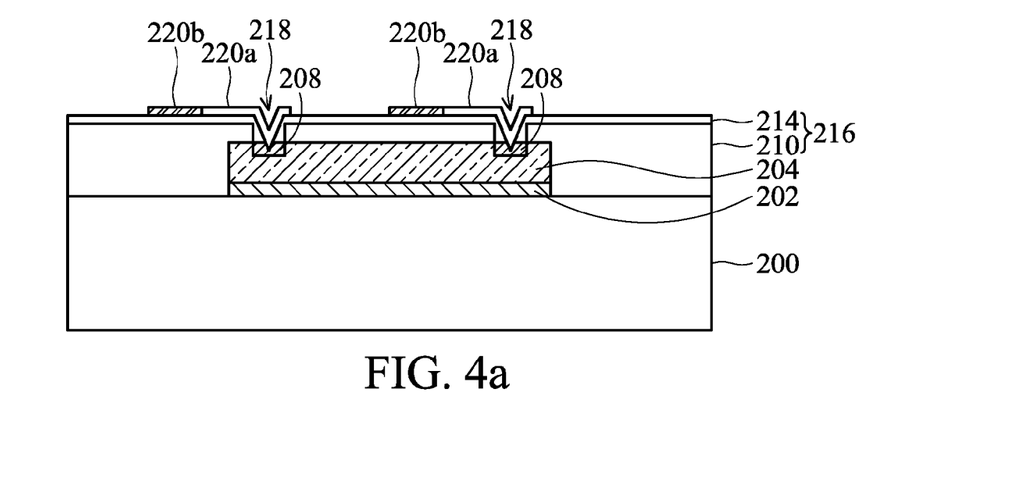
Figure 4B:
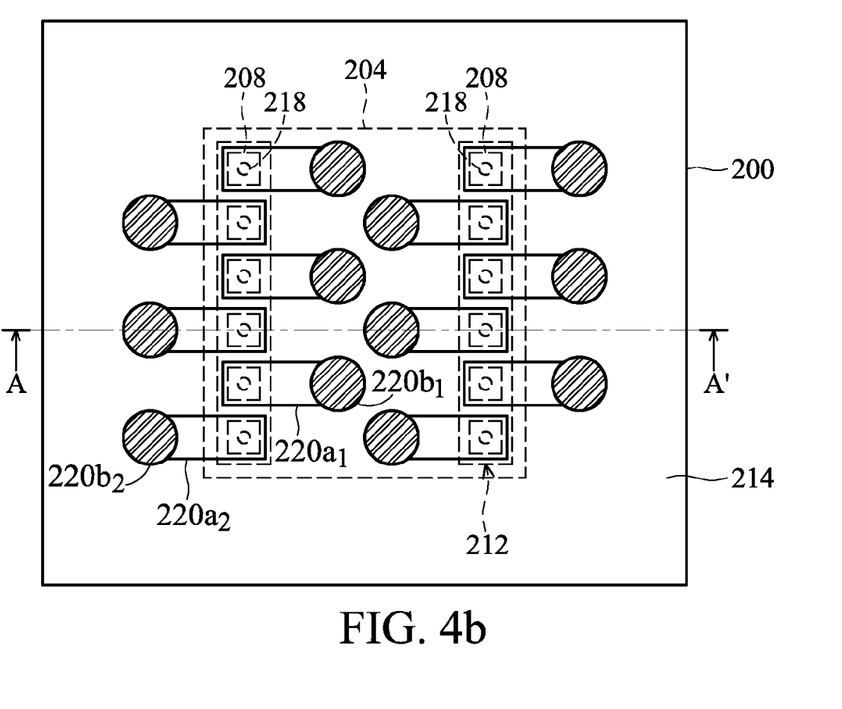

Next, referring to FIGS. 4a and 4b, FIGS. 4a and 4b shows formations of redistribution patterns 220a and under bump metallurgy (UBM) layers 220b. A plurality of redistribution patterns 220a and under bump metallurgy (UBM) layers 220b isolated from each other may be conformably formed on the second isolation layer 214 and in the plurality of second openings 218 using deposition and photolithography/etching processes. Two terminals of each of the redistribution patterns 220a respectively electrically connect to one of the conductive pads 208 and one of the UBM layers 220b. The UBM layers 220b may be optional elements. In other embodiment, the UBM layers 220b may be replaced by extending the length of the redistribution pattern 220a.

In one embodiment of the invention, for transmitting signals of the electronic device chip 204 to outside features, the redistribution patterns 220a may redistribute positions of a subsequently formed conductive bumps; for example, from a periphery region of the electronic device chip 204 to the entire electronic device chip 204. Thus, the redistribution patterns 220a may also be extended from the periphery region to the center region of the electronic device chip 204. As shown in FIG. 4a, it is noted that to maintain a required minimum spacing between subsequently formed conductive pads while increasing the number of the conductive pads, the redistribution patterns 220a formed on the any two adjacent conductive pads 208 respectively extend to the inside and outside of the electronic device chip 204. For example, the redistribution patterns $220a_1$ and $220a_2$ formed on the any two adjacent conductive pads 208 respectively extend to the inside and outside of the electronic device chip 204 so that the UBM layers $220b_1$ and $220b_2$, respectively connecting to the redistribution patterns $220a_1$ and $220a_2$, are located in the inside and outside of the electronic device chip 204. For example, the redistribution patterns 220a and the UBM layers 220b formed by conductive materials may be metals or metal alloys such as Ni layers, Ag layers, Al layers, Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. In a specific embodiment, a Ni/Ag layer may be formed on a portion of a surface or the entire surface of the metal layer.

Figure 5A:
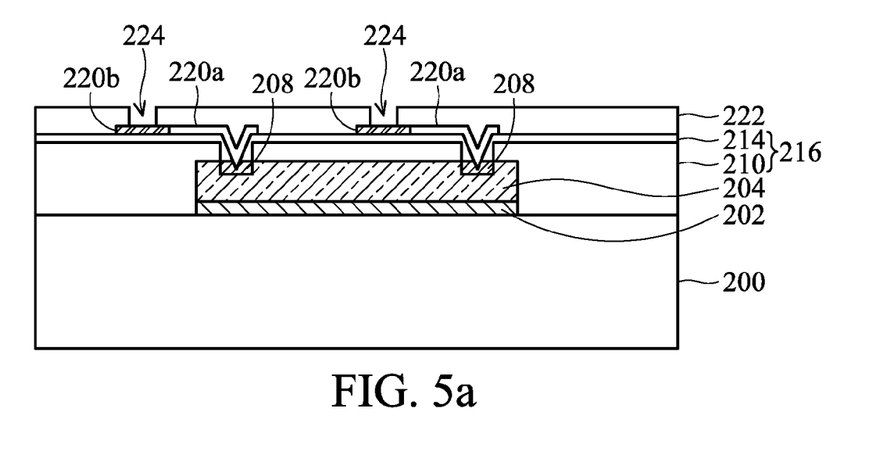
Figure 5B:
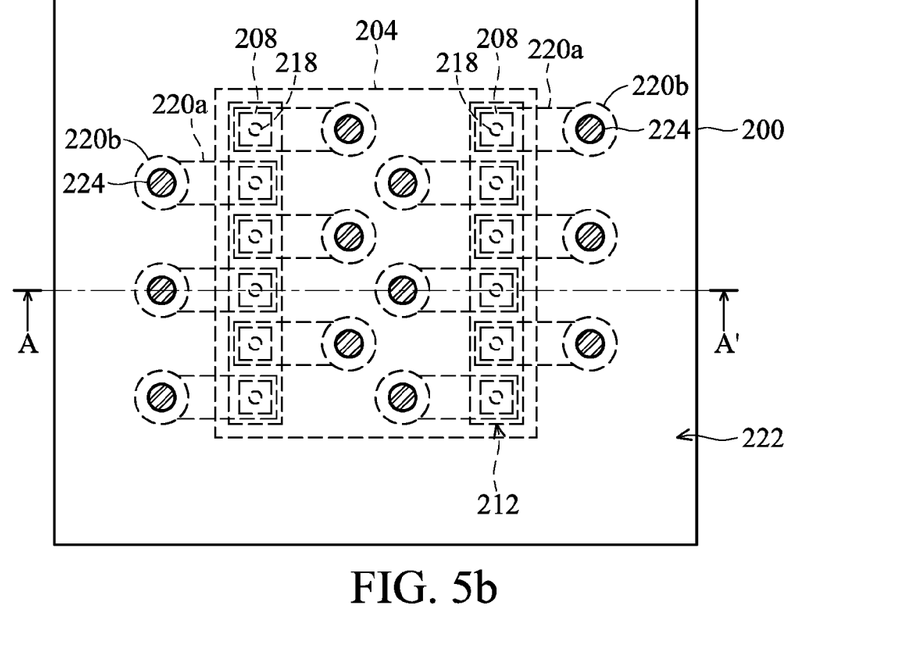

Next, referring to FIGS. 5a and 5b, FIGS. 5a and 5b show formation of a passivation layer 222. In one embodiment of the invention, the passivation layer 222 may be, for example, a solder mask. The passivation layer 222 may be formed by a method, such as, coating of a solder material. Next, a patterning process is performed on the passivation layer 222 to form terminal contact openings 224 exposing a portion of the UBM layers 220b.

Figure 6A:
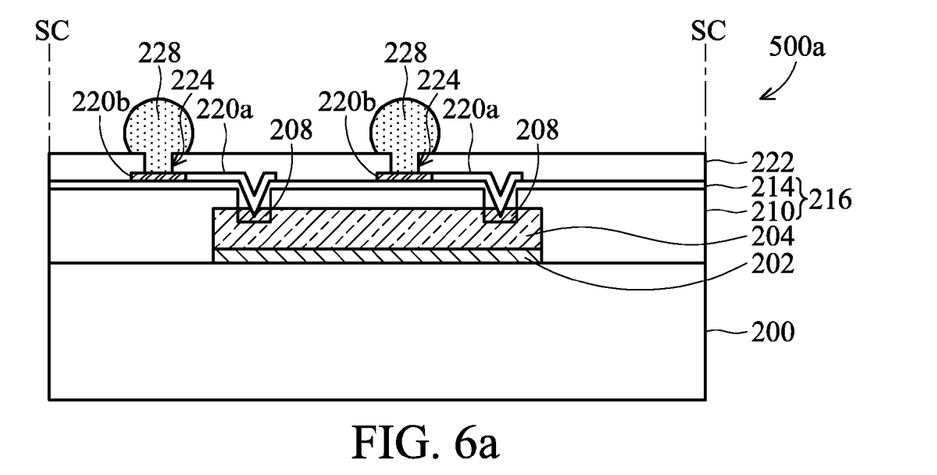
Figure 6B:
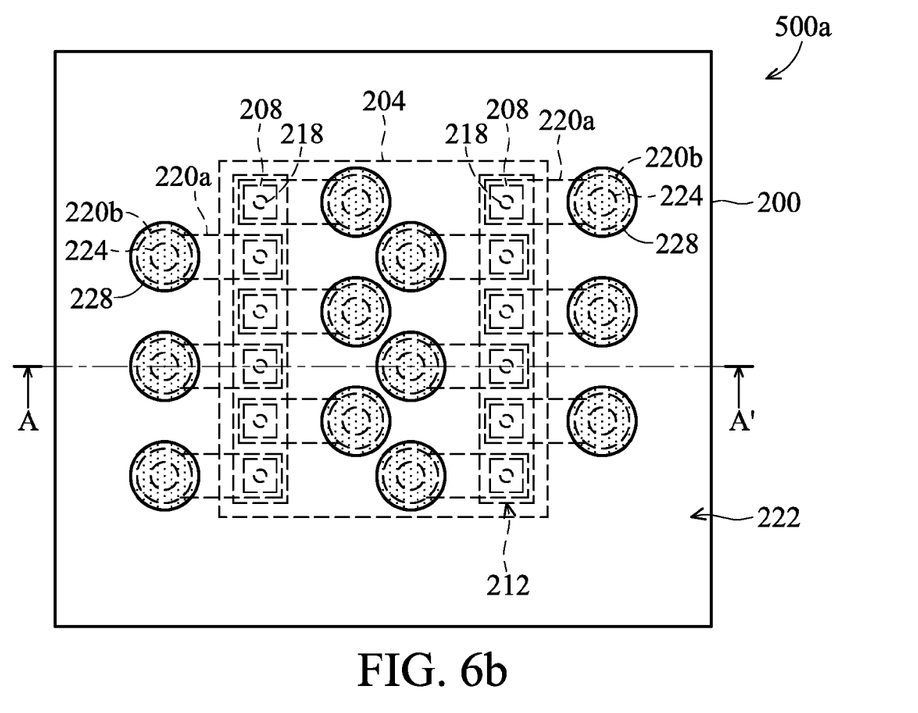

Next, referring to FIGS. 6a and 6b, a solder material is filled in the terminal contact openings 224 of the passivation layer 222 by electroplating with a patterned photoresist layer or by a screen printing process. Finally, a seed or photoresist layer is removed and a solder re-flow process is performed to form solder balls or solder pastes, thereby forming the plurality of conductive bumps 228 over the electronic device chip 204. The conductive bumps 228 are adjacent to the passivation layer 222, covering a portion of the UBM layers 220b. The conductive bumps 228 electrically connect to the conductive pads 208 of the electronic device chip 204 through the redistribution patterns 220a and the UBM layers 220b, wherein any adjacent two of the conductive bumps 228 are respectively disposed inside and outside of the electronic device chip 204. In one embodiment of the invention, the conductive bumps 228 are used to transmit input/output (I/O), ground or power signals of the electronic device chip 204. Finally, the carrier wafer 200 is cut along scribe lines SC to be divided into several individual electronic device chips 204. The electronic device package 500a is completely formed.

Figure 7:
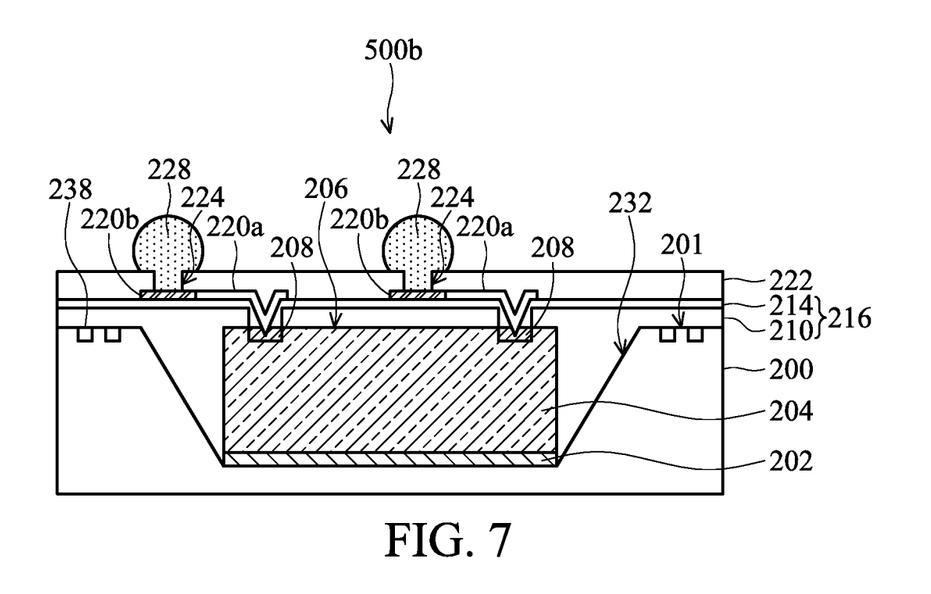
FIG. 7 is a cross section showing an electronic device package according to another embodiment of the invention.

FIG. 7 is a cross section showing an electronic device package 500b according to another embodiment of the invention. In another embodiment of the invention, the carrier wafer 200 has a cavity 232 therein to accommodate the electronic device chip 204, thereby reducing the total height of the electronic device package. Additionally, alignment patterns 238 may be disposed on a top surface 201 of the carrier wafer 200 adjacent to the cavity 232. Before the step of disposing the electronic device chip 204 in the cavity 232, the electronic device chip 204 may align to a formation position of the cavity 232 to facilitate disposition of the electronic device chip 204 in the cavity 232. As shown in FIG. 7, the first isolation layer 210 for planarization fills in the cavity 232, covering a bottom and side surfaces of the cavity 232 and side surfaces and a portion of a top surface 206 of the electronic device chip 204. Also, the first isolation layer 210 covers a top surface 206 of the carrier wafer 200.

Figure 8A:
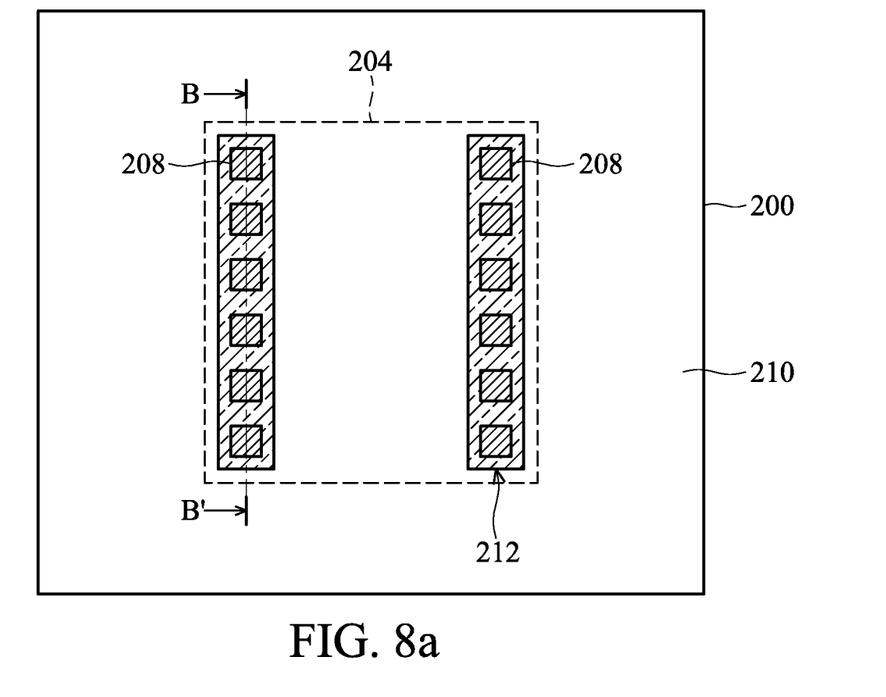
FIGS. 8a and 9a are top views of electronic device packages according to other embodiments of the invention, showing various openings of a first isolation layer.
Figure 8B:
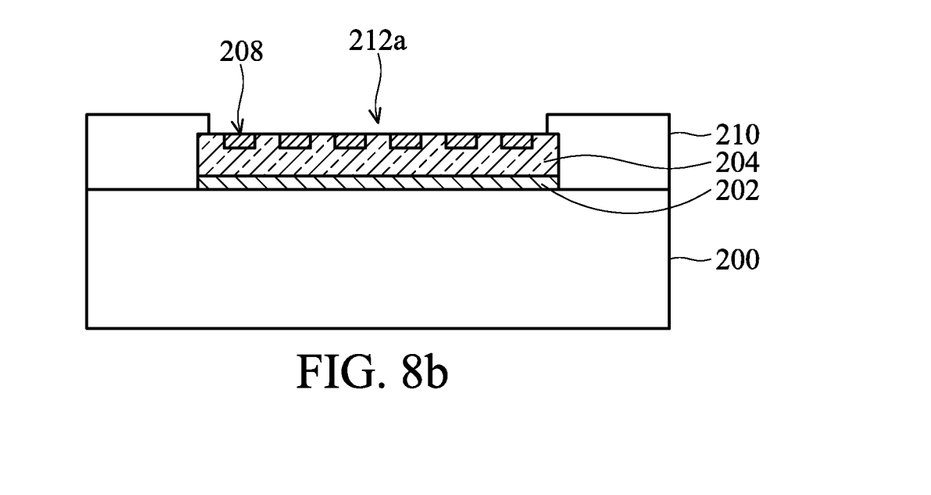
Figure 9A:
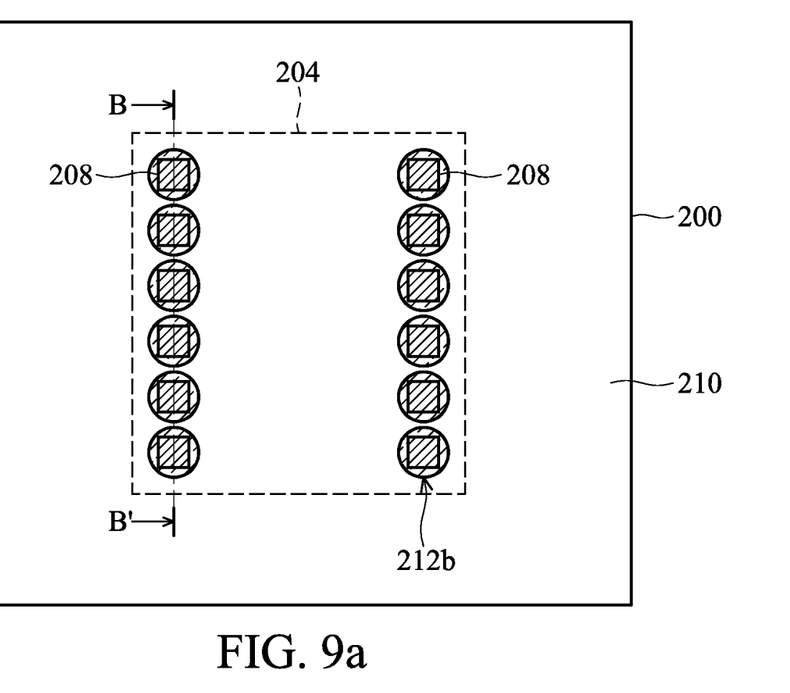
Figure 9B:
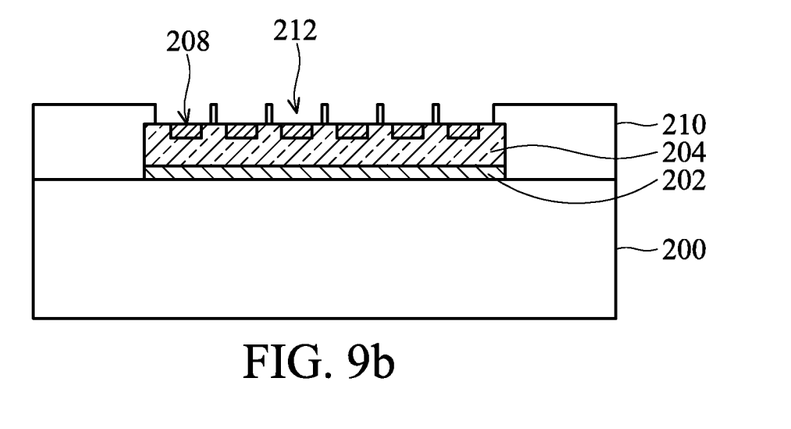

FIGS. 8a and 9a are top views of electronic device packages according to various embodiments of the invention, showing various openings of a first isolation layer 210. FIGS. 8b and 9b are cross sections taken along lines B-B' of FIGS. 8a and 9a. As shown in FIGS. 8a and 8b, numbers of the conductive pads 208 may be exposed from an opening 212a of the first isolation layer 210. Further, as shown in FIGS. 9a and 9b, each of the openings 212b of the first isolation layer 210 may expose one of the conductive pads 208.

In the electronic device package 500a or 500b, the isolation combo layer 216 used to isolate surroundings of the electronic device chip 204 from subsequently formed redistribution patterns is mainly formed by laminating two isolation layers with different functions, wherein the lower first isolation layer 210 is mainly used to planarize the surfaces of the carrier wafer 200 and the electronic device chip 204. The upper second isolation layer 214 is mainly used for openings formed therein to expose the conductive pads 208 to facilitate formation of subsequently formed conductive wires. Therefore, the first isolation layer 210 has good surface flatness, good mechanical strength and meets coefficient thermal expansion (CTE) requirements. Additionally, the second isolation layer 214 has good resolution and the coefficient of viscosity. Therefore, the isolation combo layer 216, formed by laminating the first isolation layer 210 to have a planarization function and the second isolation layer 214 to have a good resolution may have advantages which are the same as isolation layers formed of different materials Additionally, in the electronic device package 500a or 500b, for maintaining required minimum spacing between subsequently formed conductive pads while increasing the number of the conductive pads, the redistribution patterns 220a formed on the any two adjacent conductive pads 208 respectively extend to the inside and outside of the electronic device chip 204 so that any adjacent two of the conductive bumps 228 are respectively disposed inside and outside of the electronic device chip 214 to satisfy high density electronic device package requirements.

Moreover, the exemplary embodiments of the electronic device package 500a or 500b of the invention are fabricated by a wafer scale package process. Therefore, the package may have a relatively small size. Additionally, in the electronic device package, the redistribution patterns or the conductive bumps are used to electrically connect to the conductive pads of the chip rather than bond wires. Therefore, package size is further reduced. Further, the carrier wafer may be a bare wafer without any device pattern disposed thereon. Therefore, the fabrication cost is further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package, comprising:
   a carrier wafer;
   an electronic device chip disposed over the carrier wafer, wherein the electronic device chip has a plurality of conductive pads disposed thereon;
   an isolation combo layer comprising a lower first isolation layer, which covers the carrier wafer and the electronic device chip, and an upper second isolation layer, wherein the lower first isolation layer has a plurality of first openings to expose the plurality of conductive pads, and the upper second isolation layer conformably covers the lower first isolation layer and inner walls of the first openings, wherein the upper second isolation layer located in the first openings has a plurality of second openings respectively located in the first openings to expose the plurality of conductive pads;
   a plurality of redistribution patterns isolated from each other conformably formed on the isolation combo layer and in the first openings and the second openings, electrically connecting to the plurality of conductive pads, respectively; and
   a plurality of conductive bumps respectively formed on the plurality of redistribution patterns, electrically connecting to the plurality of conductive pads.

2. The electronic device package as claimed in claim 1, further comprising a protection layer covering a portion of the plurality of redistribution patterns.

3. The electronic device package as claimed in claim 1, wherein the first isolation layer is a dry film photoresist.

4. The electronic device package as claimed in claim 1, wherein the first isolation layer further comprises a silica particle therein.

5. The electronic device package as claimed in claim 1, wherein the second isolation layer comprises epoxy resin, solder mask layers, silicon oxide layers, silicon nitride layers, silicon oxynitride layers, metal oxides, polyimide, butylcyclobutene (BCB), parylene, polynaphthalenes, fluorocarbons, accrylates or combinations thereof.

6. The electronic device package as claimed in claim 1, wherein the carrier wafer has a cavity, and the electronic device chip is disposed in the cavity.

7. The electronic device package as claimed in claim 6, wherein the first isolation layer fills the cavity, covering a top surface of the carrier wafer.

8. The electronic device package as claimed in claim 6, wherein a top surface of the carrier wafer adjacent to the cavity has an alignment pattern thereon.

9. The electronic device package as claimed in claim 1, wherein a thickness of the first isolation layer is larger than that of the second isolation layer.

10. The electronic device package as claimed in claim 1, wherein each of the plurality of first openings exposes at least one the conductive pad.

11. The electronic device package as claimed in claim 1, wherein the conductive bumps electrically connected to any adjacent two of the conductive pads are respectively disposed inside and outside of the electronic device chip.

12. The electronic device package as claimed in claim 1, wherein a coefficient of viscosity of the second isolation layer is lower than that of the first isolation layer.

13. The electronic device package as claimed in claim 1, wherein a mechanical strength of the first isolation layer is larger than that of the second isolation layer.

14. An electronic device package, comprising:
a carrier wafer;
an electronic device chip disposed over the carrier wafer, wherein the electronic device chip has a plurality of conductive pads disposed thereon;
an isolation combo layer comprising a lower first isolation layer, which covers the carrier wafer and the electronic device chip, and an upper second isolation layer, wherein the lower first isolation layer has a plurality of first openings to expose the plurality of conductive pads, and the upper second isolation layer conformably covers the lower first isolation layer and inner walls of the first openings, wherein the upper second isolation layer located in the first openings has a plurality of second openings respectively located in the first openings to expose the plurality of conductive pads;
a plurality of redistribution patterns isolated from each other conformably formed on the isolation combo layer and in the openings, electrically connecting to the plurality of conductive pads, respectively; and
a plurality of conductive bumps respectively formed on the plurality of redistribution patterns, electrically connecting to the plurality of conductive pads,
wherein there is no any redistribution pattern located between the lower first isolation layer and the upper second isolation layer.

15. The electronic device package as claimed in claim 14, further comprising a protection layer covering a portion of the plurality of redistribution patterns.

16. The electronic device package as claimed in claim 14, wherein the first isolation layer is a dry film photoresist.

17. The electronic device package as claimed in claim 14, wherein the first isolation layer further comprises a silica particle therein.

18. The electronic device package as claimed in claim 14, wherein the second isolation layer comprises epoxy resin, solder mask layers, silicon oxide layers, silicon nitride layers, silicon oxynitride layers, metal oxides, polyimide, butylcyclobutene (BCB), parylene, polynaphthalenes, fluorocarbons, accrylates or combinations thereof.

19. The electronic device package as claimed in claim 14, wherein the carrier wafer has a cavity, and the electronic device chip is disposed in the cavity.

20. The electronic device package as claimed in claim 19, wherein the first isolation layer fills the cavity, covering a top surface of the carrier wafer.

21. The electronic device package as claimed in claim 19, wherein a top surface of the carrier wafer adjacent to the cavity has an alignment pattern thereon.

22. The electronic device package as claimed in claim 14, wherein a thickness of the first isolation layer is larger than that of the second isolation layer.

23. The electronic device package as claimed in claim 14, wherein each of the plurality of openings exposes at least one the conductive pad.

24. The electronic device package as claimed in claim 14, wherein the conductive bumps electrically connected to any adjacent two of the conductive pads are respectively disposed inside and outside of the electronic device chip.

25. The electronic device package as claimed in claim 14, wherein a coefficient of viscosity of the second isolation layer is lower than that of the first isolation layer.

26. The electronic device package as claimed in claim 14, wherein a mechanical strength of the first isolation layer is larger than that of the second isolation layer.

* * * * *